(12) United States Patent
Yoshihara et al.

(10) Patent No.: US 6,734,551 B2
(45) Date of Patent: May 11, 2004

(54) SEMICONDUCTOR DEVICE

(75) Inventors: Hiroyuki Yoshihara, Tokyo (JP);
Kenichi Hayashi, Tokyo (JP); Hisashi Kawafuji, Fukuoka (JP); Mitsugu Tajiri, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/126,606

(22) Filed: Apr. 22, 2002

(65) Prior Publication Data

US 2003/0075783 A1 Apr. 24, 2003

(30) Foreign Application Priority Data

Oct. 19, 2001 (JP) ........................................ 2001-321590

(51) Int. Cl.[7] .............................................. H01L 23/10
(52) U.S. Cl. ...................... 257/706; 257/707; 257/796; 257/676; 257/723; 257/724
(58) Field of Search ................................ 257/706, 707, 257/796, 676, 723–724

(56) References Cited

U.S. PATENT DOCUMENTS

| | | | | |
|---|---|---|---|---|
| 5,430,331 A | * | 7/1995 | Hamzehdoost et al. | 257/796 |
| 5,703,399 A | * | 12/1997 | Majumdar et al. | 257/723 |
| 6,002,166 A | * | 12/1999 | Noda et al. | 257/666 |

* cited by examiner

*Primary Examiner*—Luan Thai
(74) *Attorney, Agent, or Firm*—Oblon, Spivak, McClelland, Maier & Neustadt, P.C.

(57) ABSTRACT

Each lead frame for a power chip has one side main surface on which a power chip is mounted and a suspension lead part provided projectingly from a region reserved for forming mold resin in addition to a lead terminal. Thus, the lead frame can be supported by the plurality of suspension lead parts in a molding step. A metal block is provided on the other main surface of the lead frame to face the power chip. Consequently, a semiconductor device with good heat radiation properties and good insulation breakdown voltages can be obtained.

14 Claims, 11 Drawing Sheets

F I G . 5
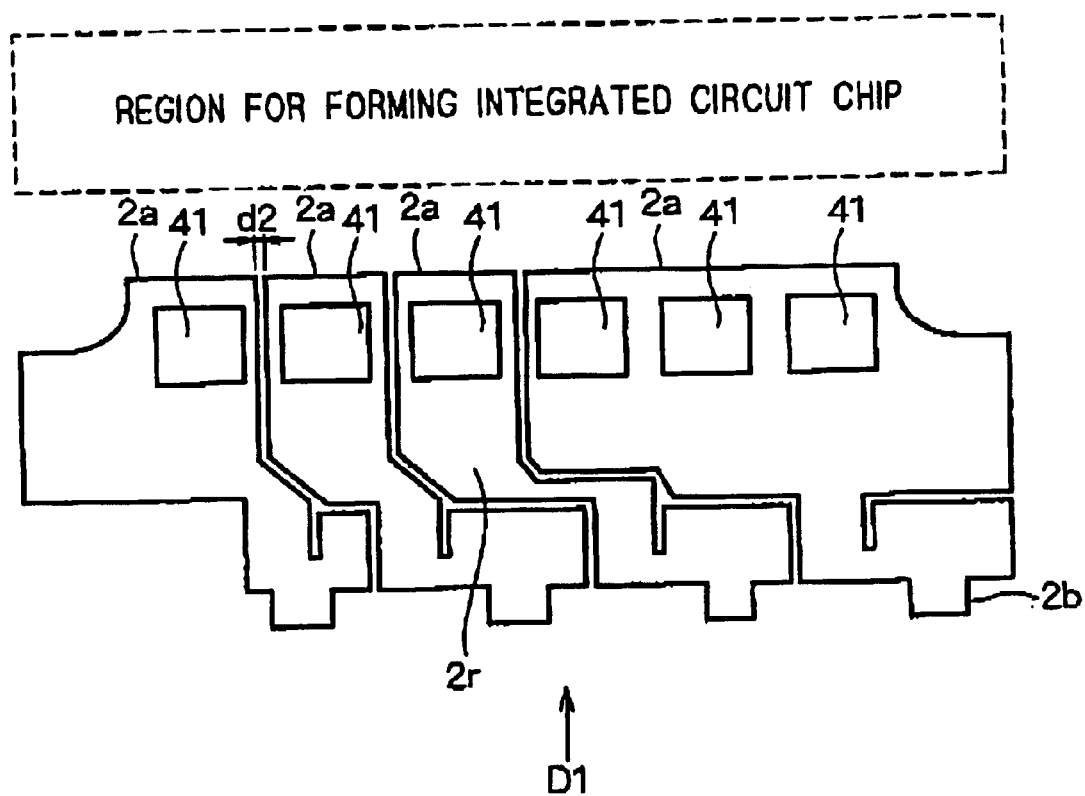

SEMICONDUCTOR DEVICE

BACKGROUND OF THE INVENTION

1. Field of the Invention

The present invention relates to a structure of a semiconductor device, and more particularly to a structure of a power semiconductor device used for power control, 2. Description of the Background Art FIG. 15 is a sectional view schematically illustrating a structure of a power semiconductor device according to the background art. As shown in FIG. 15, the power semiconductor device according to the background art comprises a power chip 1 having a power element, a lead frame 20 made of a metal thin plate, a metal block 5 functioning as a heat sink for radiation and a mold resin 6.

The lead frame 20 has a die pad part 3 and an inner lead part 4. The power chip 1 is jointed to the die pad part 3 with solder 9 as a binder. An electrode (not shown) formed on the power chip 1 is connected to the inner lead part 4 of the lead frame 20 by an aluminum wire 8. The metal block 5 has a projection almost at its center and is arranged such that the projection faces the power chip 1 leaving a predetermined spacing with respect to a surface of the lead frame 20 opposite to the power chip 1. The mold resin 6 exposes a surface of the metal block 5 opposite to the lead frame 20 while sealing the power chip 1, the lead frame 20 and the metal block 5.

Attached to the exposed part of the metal block 5 is an external heat radiator 11. Part of the mold resin 6 present between the projection of the metal block 5 and the lead frame 20 is called a resin insulation layer 27.

In the power semiconductor device according to the background art, heat generated in the power chip 1 is emitted to the outside from the external heat radiator 11 through the lead frame 20, the resin insulation layer 27 and the metal block 5. The metal block 5 and the external heat radiator 11 made of aluminum or copper and have thermal conductivities of approximately 230 W/mK and approximately 390 W/mK, respectively. The lead frame 20, which is also made of metal such as copper, has a thermal conductivity of substantially the same degree as the metal block 5 and the external radiator 11. The resin forming the resin insulation layer 27 has a thermal conductivity of 1–3 W/mK. Thus, the resin insulation layer 27 has the thermal conductivity of substantially one hundredth that of any other material. This is a main factor that hinders thermal conduction.

Heat radiation properties of a semiconductor device are determined by the thickness and thermal conductivity of a material through which heat is conducted, an area of the material through which heat is conducted, and the like. The power semiconductor device according to the background art can achieve improved heat radiation properties by thinning the resin insulation layer 27 to thereby reduce part that has a low thermal conductivity through which heat is conducted. However, the resin insulation layer 27 needs an insulation breakdown voltage of several thousands of volts. This imposes limitations on its thickness to fall into the neighborhood of 0.5 mm, and improvements in the heat radiation properties are thus limited.

The thermal conductivity of the resin insulation layer 27 could be increased to as high as approximately 5 W/mK by using ceramic powder having a high thermal conductivity such as aluminum nitride powder or silicon nitride powder as a filler for the resin forming the resin insulation layer 27 to increase a filling factor. However, the resin insulation layer 27 is part of the mold resin 6, which causes the resin filled with ceramic powder to be used even for elements other than the resin insulation layer 27, i.e., elements that do not require high thermal conductivities. This results in a wasted use of expensive resin. In consequence, material costs of a semiconductor device are increased.

Heat generated in the power chip 1 is first conducted through the lead frame 20, and next, through the resin insulation layer 27. It is generally impossible to make the lead frame 20 thick in terms of processing unlike the metal block 5 or the like. Thus, the lead frame 20 has a thermal diffusion effect inferior to that of the metal block 5 or the like. This makes it difficult to fully extend an area of the resin insulation layer 27 through which heat is conducted, which has been a factor that imposes limitations on improvements in heat radiation properties.

SUMMARY OF THE INVENTION

It is an object of the present invention is to provide a semiconductor device with good heat radiation properties and good insulation breakdown voltages.

According to the present invention, the semiconductor device includes first a second semiconductor chips, first and second lead frames, a metal block, and resin. The first and second lead frames have one side main surfaces on which the first and second semiconductor chips are mounted, respectively. The metal block is provided on the other main surface of the first lead frame. The resin is formed to cover the first and second semiconductor chips, the first and second lead frames and the metal block. The first lead frame has a plurality of suspension lead parts projecting from the resin.

The present invention radiates well heat generated in the first semiconductor chip by means of heat radiation through the metal block provided on the other main surface of the first lead frame. At this time, the metal block, which is covered with resin, can maintain insulation relationship with the outside.

Further, the first lead frame, having the plurality of suspension lead parts, is brought into a state of a beam supported at two or more positions at least in the resin molding step, according to which its stiffness can be improved. This allows the resin covering the metal frame to be formed uniformly in thickness. As a result improved heat radiation properties can be obtained while securing insulation properties.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is an explanatory plan view briefly illustrating a power chip to be mounted on a lead frame;

DESCRIPTION OF THE PREFERRED EMBODIMENTS

<Basic Principle>
(Power Semiconductor Device Including a Metal Block)

Figure 1:
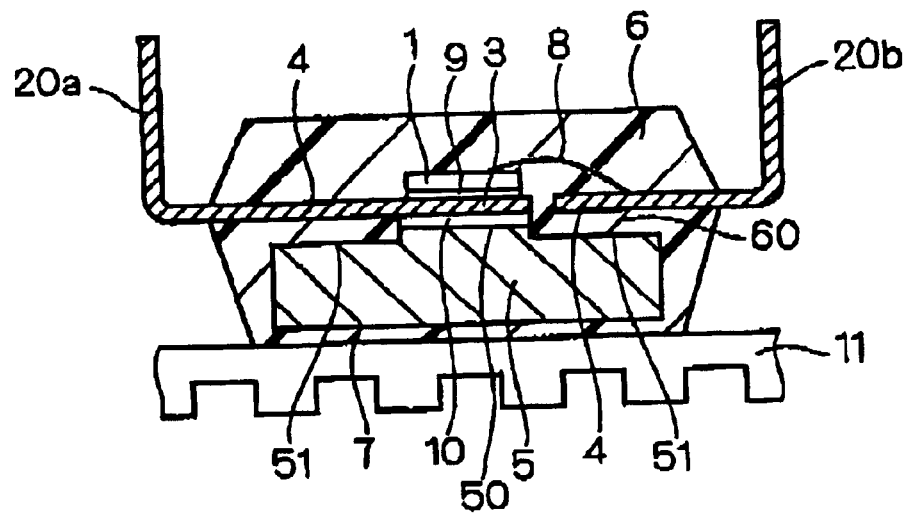
FIG. 1 is a sectional view schematically illustrating a structure of a semiconductor device according to the basic principle of the present invention.

FIG. 1 is a sectional view schematically illustrating a structure of a semiconductor device according to a basic principle of the present invention. As shown in FIG. 1, the semiconductor device according to the basic principle includes the power chip 1, lead frames 20a, 20b, the metal block 5 and the mold resin 6.

The lead frames 20a and 20b are made of metal having a good thermal conductivity such as a thin plate of a copper alloy. The lead frame 20a has the die pad part 3 and the inner lead part 4, and the lead frame 20b has the inner lead part 4. The power chip 1 has electrodes (not shown) provided on its both surfaces, and is mounted on the die pad part 3 of the lead frame 20a and jointed thereto with the solder 9 such that one of the electrodes on one of its surfaces is in contact with the lead frame 20a. The other of the electrodes on the other surface of the power chip 1 is connected to the inner lead part 4 of the lead frame 20b by the aluminum wire 8. The lead frames 20a and 20b are separated from each other, and the electrodes formed on the both surfaces of the power chip 1 are insulated from each other.

The metal block 5, made of aluminum or copper, for example, is jointed to the lead frame 20a with a jointing material 10 on one surface opposite to the power chip 1. More specifically, the metal block 5 has a junction surface 50 and a non-junction surface 51 on its one side main surface and is arranged such that the junction surface 50 and the non-junction surface 51 face the lead frames 20a and 20b. The junction surface 50 is formed projectingly toward the power chip 1 further than the non-junction surface 51 and is jointed to the lead frame 20a with the jointing material 10 so as to face the power chip 1.

In other words, the metal block 5 has a projection on one of its surfaces, and the projection is jointed to the lead frame 20a so as to face the power chip 1. The other surface of the metal block 5 opposite to the lead frame 20a is larger than a surface of the power chip 1 jointed to the lead frame 20a. The non-junction surface 51 and the lead frame 20b form an insulation space 60 therebetween.

The mold resin 6, made of epoxy resin, for example, provides an insulation layer 7 for the metal block 5 on the surface opposite to the lead frames 20a and 20b while covering and sealing the power chip 1, the lead frames 20a, 20b and the metal block 5. The external heat radiator 11 is attached to the insulation layer 7 on a surface opposite to the metal block 5.

In the semiconductor device of the basic principle having the above-described structure, heat generated in the power chip 1 is conducted through the solder 9, the lead frames 20a, 20b, the jointing material 10, the metal block 5 and the insulation layer 7, and is emitted to the outside from the external heat radiator 11. The jointing material 10 is not required to ensure electric insulation between the lead frame 20a and the metal block 5. Thus, any material can be employed without considering its insulation breakdown voltage. More specifically, when another semiconductor device is attached to the external heat radiator 11, the insulation layer 7 maintains insulation between the semicondutor devices. Thus, it is not necessary to consider the insulation breakdown voltage of the jointing material 10. Therefore, the joining material 10 may be made of a material such as solder that has a thermal conductivity better than that of the insulation layer 7. As a result, heat generated in the power chip 1 is conducted well from the lead frame 20a to the metal block 5.

Moreover, even in the case in which a resin adhesive is employed as the jointing material 10, the jointing material 10 can be made thinner than the resin insulation layer 27 in the aforementioned background art. More specifically, the thickness of the jointing material 10 can be set at 10–40 μm and can be reduced to substantially one tenth that of the conventional resin insulation layer 27. Alternatively, an adhesive mixed with, for example, metal powder as a filler, i.e., a binder having a high thermal conductivity may be used. In consequence, the joint material 10 made of a resin adhesive can be improved in the thermal conductivity 5 to 10 times (5–20 W/mK) that of the conventional resin insulation layer 27. That is, even when a resin adhesive is used for the jointing material 10, heat generated in the power chip 1 can be conducted well to the metal block 5.

Figure 2:
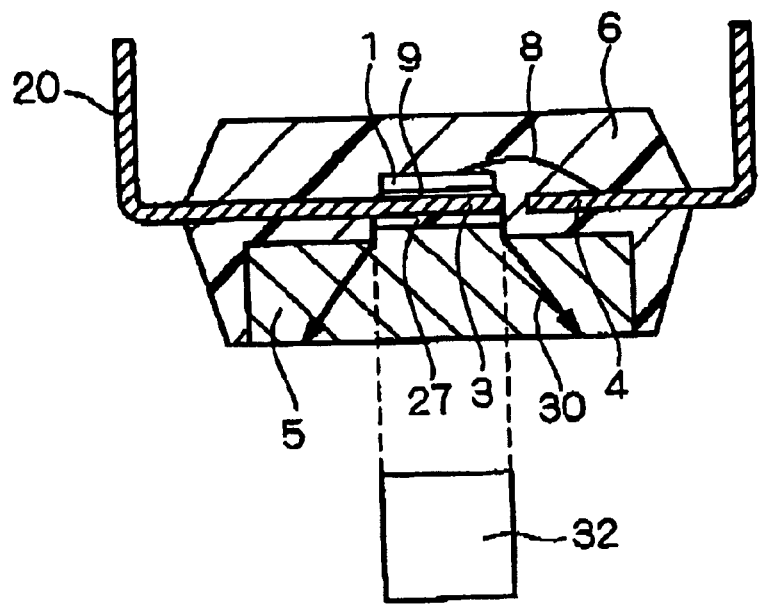
FIG. 2 is an explanatory view illustrating the way heat is conducted in a semiconductor device according to the background art.
Figure 3:
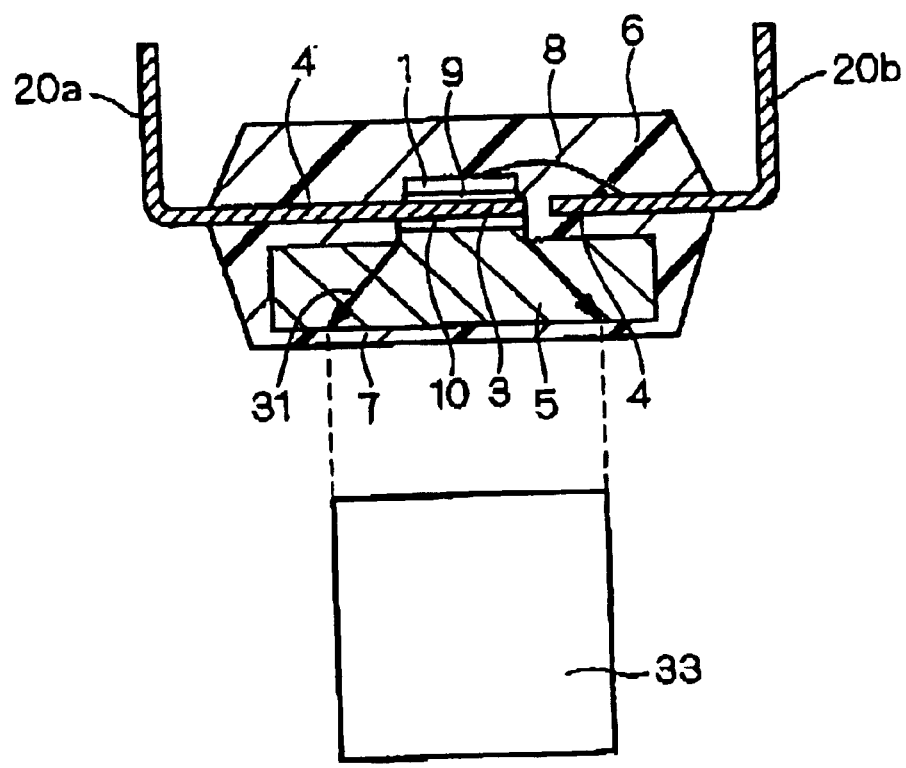
FIG. 3 is an explanatory view illustrating the way heat is conducted in the semiconductor device according to the basic principle shown in FIG. 1.

Next, heat conducting through the insulation layer 7 which is a main factor that hinders heat conduction will be described in detail. FIGS. 2 and 3 illustrate the way heat generated in the power chip 1 is conducted. FIG. 2 shows the way heat is conducted in the power semiconductor device according to the above described background art, and FIG. 3 shows the way heat is conducted in the semiconductor device according to the basic principle. As indicated by a thermal diffusion direction 30 in FIG. 2, heat generated in the power chip 1 is diffused in a slightly horizontal direction at the lead frame 20 in the background art, however, diffusion is not carried out sufficiently due to the thinness of the lead frame 20. Thus, an area 32 of the resin insulation layer 27 which is a main factor that hinders heat conduction in the background art through which heat is conducted is almost the same as the area of the power chip 1. On the other hand, as indicated by a thermal diffusion direction 31 in FIG. 3, heat generated in the power chip 1 is diffused in a slightly horizontal direction at the lead frame 20a and is further diffused at the metal block 5 having a sufficient thickness in the basic principle. Therefore, an area 33 of the insulation layer 7 through which heat is conducted is sufficiently larger than the area of the power chip 1. In short, a main factor that hinders heat conduction in the basic principle is smaller than that in the background art.

As has been described, the semiconductor device according to the basic principle provides improved heat radiation properties.

Further, since the metal block 5 and the lead frame 20b form the insulation space 60 therebetween, the metal block 5 may be increased in size as nearly large as the outside dimension of the semiconductor device while the electrodes on the both surfaces of the power chip 1 are insulated from each other. As a result improved heat radiation properties can be obtained.

Furthermore, the lead frame 20a and the metal block 5 are jointed just before the step of forming the mold resin 6 in the basic principle. Thus, manufacturing can be performed up to the wiring of the aluminum wire 8 by the same process and apparatus as conventional ones. This permits a reduction of new capital investments and the like.

(Power Semiconductor Device Including a Plurality of Types of Chips)

A general power semiconductor device is equipped with: a power chip for switching a large current having an element such as an insulated gate bipolar transistor (hereinafter referred to as "IGBT") or a fly wheel diode (hereinafter referred to as "FWD"); and an integrated circuit chip for controlling the power chip such as a low voltage integrated circuit (hereinafter referred to as "LVIC") or a high voltage integrated circuit (hereinafter referred to as "HVIC").

In other words, the power chip and the integrated circuit chip on which the aforementioned metal block is to be formed are mounted on lead frames different from each other, and predetermined parts such as a chip and a frame are electrically connected by using a wire bonding technique or equivalent. Thereafter, a resin molding step is carried out, thereby forming the power semiconductor device including a plurality of types of semiconductor chips.

Figure 4:
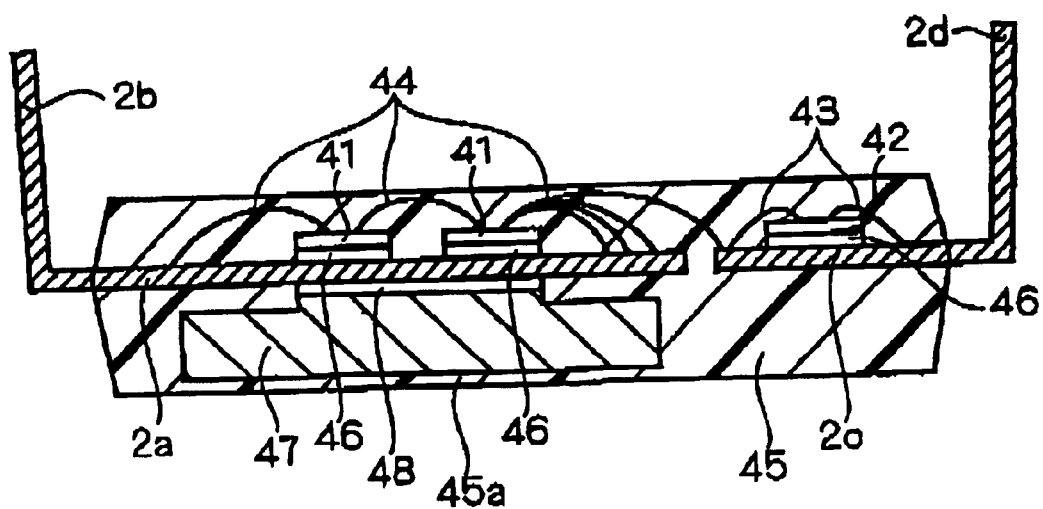
FIG. 4 is a sectional view illustrating a sectional structure of a power semiconductor device including a plurality of types of chips.

FIG. 4 is a sectional view illustrating a structure of such power semiconductor device. As shown in FIG. 4, a power chip 41 and an integrated circuit chip 42 are jointed to one side main surfaces of lead frames 2a and 2c, respectively, with a jointing material 46 by using a die bonding technique. Next, the power chip 41 is electrically connected to part of predetermined inner leads of the lead frames 2a and 2c by an aluminum wire 44. Further, the integaed circuit chip 42 and a predetermined inner lead of the lead frame 2c are electrically connected by a gold wire 43. The reason for employing the aluminum wire 44 is that the power chip handles a large current.

On the other hand, a metal block 47 having a projection in a region corresponding to the power chip 41 is jointed to the other main surface of the lead frame 2a with a jointing material 48.

Further, a mold resin 45 such as epoxy resin is used to perform transfer molding, thereby covering and sealing the power chip 41, the integrated circuit chip 42, the lead frames 2a, 2c and the metal block 47.

The lead frames 2a and 2c are bent at their ends such that they are used as lead terminals 2b and 2d.

In such power semiconductor device including a plurality of types of semiconductor chips, the power chip 41 is formed on the side of the lead terminal 2b and the integrated circuit chip 42 on the side of the lead terminal 2d. Therefore, the lead frame 2a on which the power chip 41 is mounted is in a cantilever state that is supported only by the side of the lead frame 2b in the molding step.

In the molding step, viscous force resulting from resin flow is added to the lead frame 2a on which the power chip 41 is mounted. The lead frame 2a is in the cantilever state as described above, it has a low stiffness and is easily deformed or displaced. More specifically, there arises a problem in that the lead frame 2a is easily inclined in the flowing direction of the mold resin 45. In consequence, an inclination of the lead frame 2a results in non-uniformity of the mold thickness of the mold resin 45 under the power chip 41.

Therefore, a thin part and a thick part are generated in the mold resin 45. There is concern that the thin part 45a of the mold resin 45 under the metal block 47 may have faulty insulation. Therefore, the mold resin needs to be sufficiently thick for carrying out the molding step. In this case, however, a problem arises in that the mold thickness becomes thicker than necessary at the thick part and the thermal resistance is thus increased, resulting in hindrance of heat radiation.

FIG. 5 is an explanatory plan view briefly illustrating the power chip 41 to be mounted on the lead frame 2a. Generally, as shown in FIG. 5, a plurality of power chips 41 are formed on a plurality of (partial) lead frames 2a provided adjacently to one another.

In the case that the lead frame 2a on which the power chip 41 is mounted shown in FIG. 5 has a region 2r extending diagonally with respect to an injecting direction D1 of the mold resin, the lead frame 2a may be deformed and vertically bent to the flowing direction of the mold resin, causing concern that contact failure might occur between adjacent lead frames 2a and 2a. To prevent this, the lead frames 2a need to be increased in width to improve their stiffness. However, an increase in the width of the lead frames 2a reduces an insulation distance d2 between adjacent lead frames 2a and 2a, causing a problematic deterioration in insulation properties. In order to maintain insulation properties, a pitch between adjacent lead frames 2a and 2a needs to be widened. This causes a problem in that a device has to be increased in size.

Further, another problem arises in that an increase in an area of the metal block 47 that is in contact with the flow of the mold resin and an increase in the accompanying viscous force cause the above problem to be more significant.

<First Preferred Embodiment>

Figure 6:
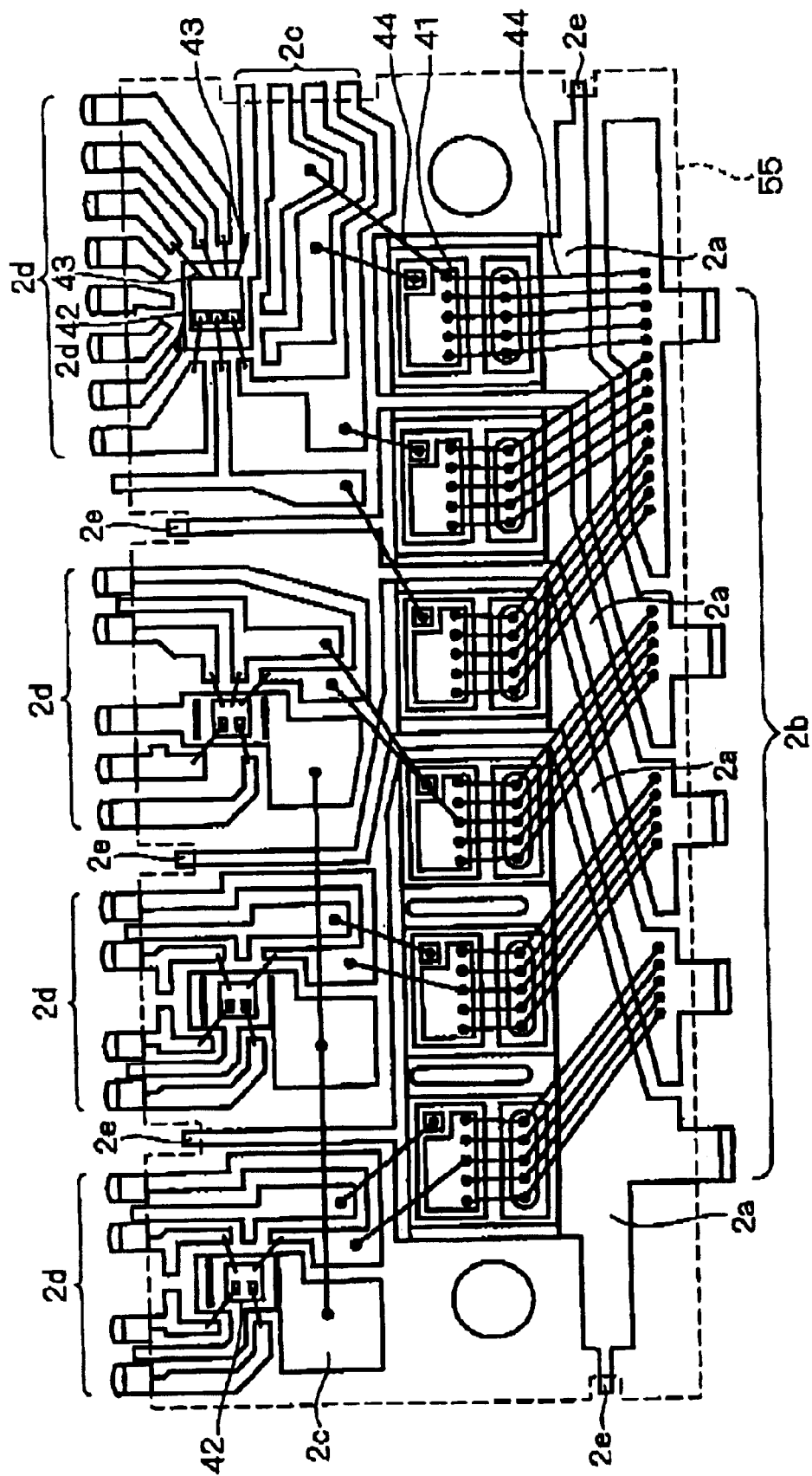
FIG. 6 is a plan view schematically illustrating a planar structure of a power semiconductor device according to a first preferred embodiment of the present invention before resin sealing.
Figure 7:
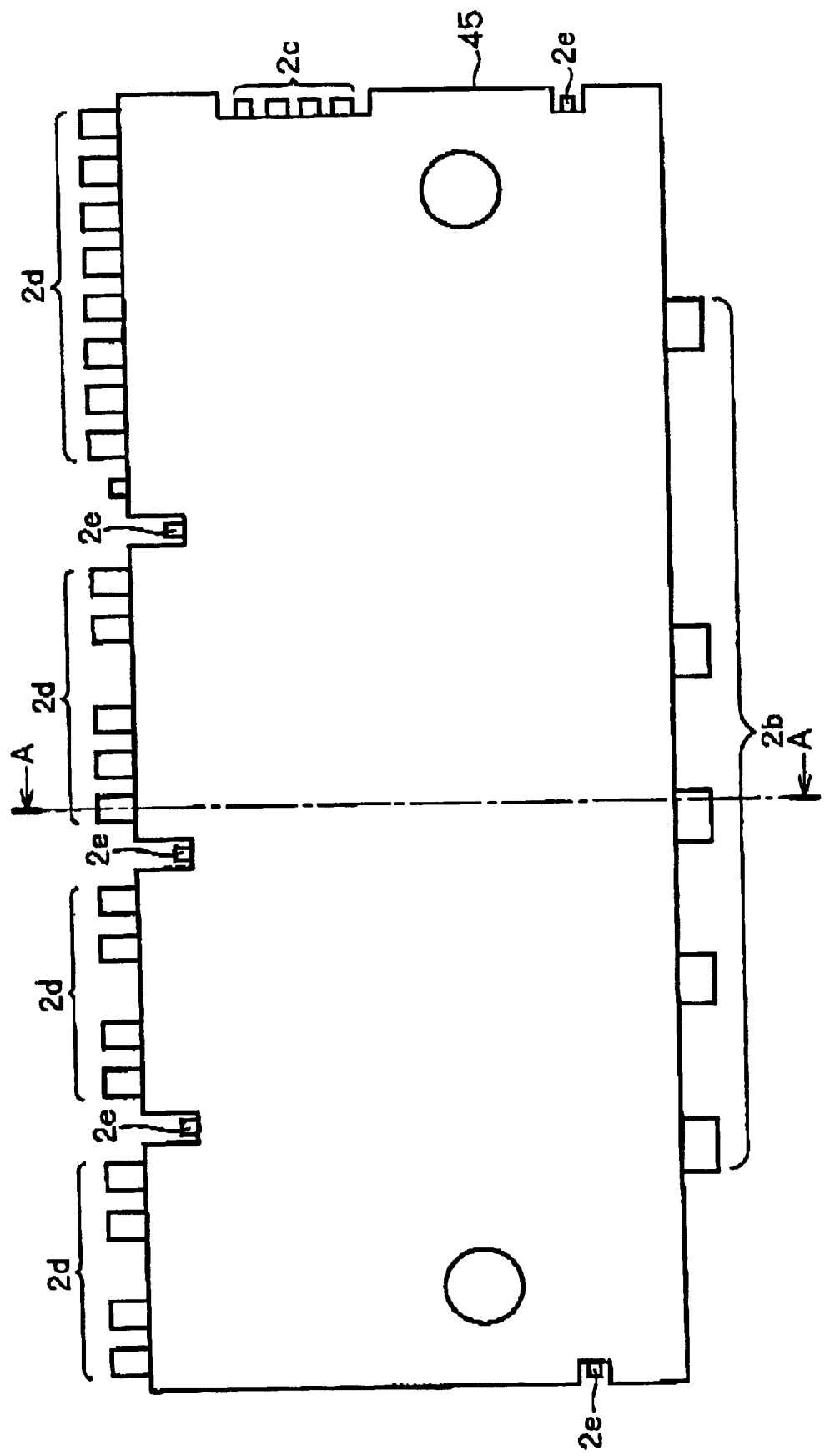
FIG. 7 is a plan view schematically illustrating a planar structure of the power semiconductor device according to the first preferred embodiment after the resin sealing.

FIG. 6 is a plan view schematically illustrating a planar structure of a power semiconductor device according to the first preferred embodiment of the invention before resin sealing. FIG. 7 is a plan view schematically illustrating a planar structure of the power semiconductor device according to the first preferred embodiment after the resin sealing. FIG. 6 shows a region 55 reserved for forming mold resin by dotted lines.

In the power semiconductor device, the power chip 41 including the power chip 1 for switching a large current such as IGBT or FWD and the integrated circuit chip 42 for controlling the power chip 41 such as LVIC or HVIC are mounted on the lead frames 2a and 2c, respectively.

As shown in FIG. 6, each (partial) lead frame 2a for the power chip has a suspension lead part 2e to be used as a support in the resin sealing provided projectingly from the region 55 in addition to the lead terminal 2b. The lead frame 2a can thus be supported by a plurality of suspension lead parts 2b and 2e in the molding (the resin sealing step).

Figure 8:
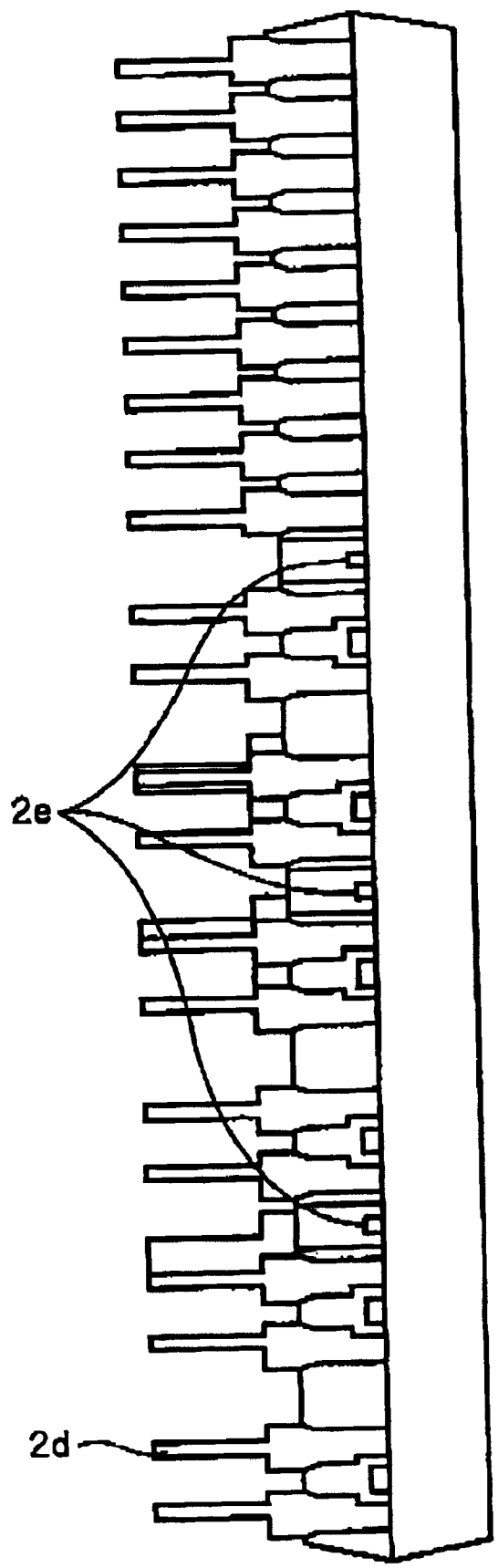
FIG. 8 is a sectional view schematically illustrating a sectional structure of the power semiconductor device according to the first preferred embodiment after the resin sealing.
Figure 9:
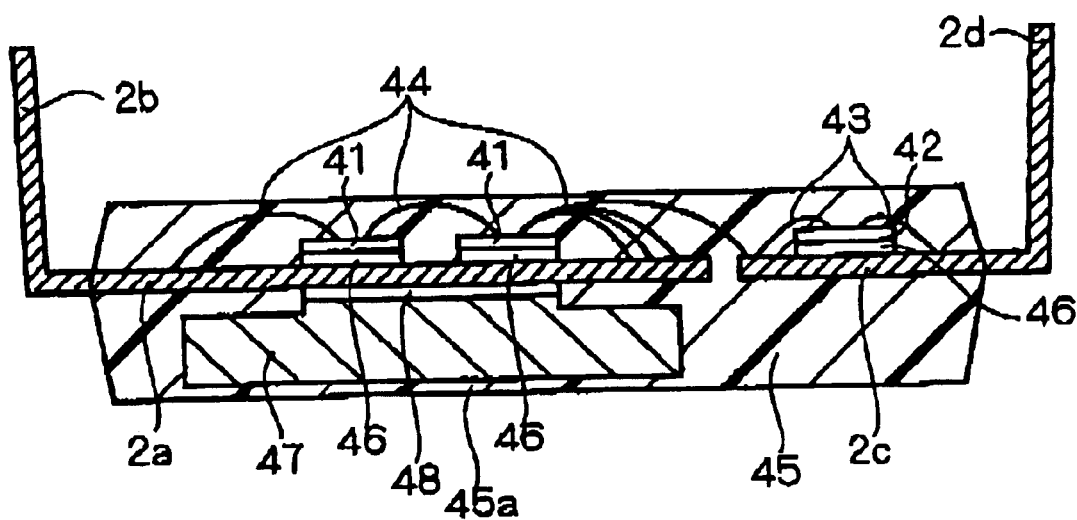
FIG. 9 is a sectional view illustrating a side structure of the power semiconductor device according to the first preferred embodiment after the resin sealing.

FIG. 8 is a sectional view schematically illustrating a sectional structure of the power semiconductor device according to the first embodiment after the resin sealing. FIG. 9 is a sectional view illustrating a side structure of the power semiconductor device according to the first embodiment after the resin sealing. FIG. 8 corresponds to a section taken along the line A—A of FIG. 7, and FIG. 9 corresponds to a side surface viewed from the lead terminal 2d side of FIG. 7.

Referring to FIGS. 6 to 9, a method of manufacturing the power semiconductor device according to the first embodiment will be described.

The power chip 41 and the integrated circuit chip 42 are mounted on one side main surfaces of the lead frames 2a and 2c, respectively, with the jointing material 46 using the die bonding technique.

Next, the power chip 41 and part of predetermined inner leads of the lead frame 2a are electrically connected by the aluminum wire 44 using the wire bonding technique. The integrated circuit chip 42 and predetermined inner leads of the lead frame 2c are also electrically connected by a gold wire 43.

The metal block 47 is placed on the other main surface of the lead frame 2a opposite to its one side main surface so as to face the power chip 41 and is jointed thereto with the jointing material 48. The metal block 47 can thus be provided on the other main surface of the lead frame 2a.

Thereafter, transfer molding is performed using epoxy resin, for example, thereby covering and sealing the power chip 41, the integrated circuit chip 42 and the metal block 47 with the mold resin 45.

Lastly, an unnecessary part of the leads is cut off and the lead terminals 2b and 2d are bent, thereby completing the semiconductor device.

The metal block 47 is made of aluminum or copper, for example, and heat generated in the power chip 41 is emitted to the outside through the jointing material 46, the lead frame 2a, the jointing material 48, the metal block 47 and an insulation layer 45a (part of the mold resin 45).

The meal block 47 is entirely covered with the mold resin 45 to be insulated from the outside. The jointing material 48 is not required to ensure electric insulation between the lead frame 2a and the metal block 47. Thus, any material can be employed without considering its insulation breakdown voltage. Therefore, the jointing material 48 may be made of a material such as solder that has a thermal conductivity better than that of the insulation layer 45a. As a result, heat generated in the power chip 41 is conducted well from the lead frame 2a to the metal block 47.

Further, the metal block 47 can be increased in size to the extent of the outside dimension of the mold resin 45 of the semiconductor device with the electrodes on the both surfaces of the power chip 41 insulated from each other. As a result, improved heat radiation properties can be obtained.

More specifically, the metal block 47 has a surface opposite to the jointing material 48, which is larger than the other jointed to the jointing material 48. Accordingly, heat can be conducted with the jointing material 48 and the metal block 47 jointed to each other by a minimum area of almost the same size as the power chip 41, and an electric circuit is formed by the lead frame 2a at the peripheral part of the chip. Thus, size reduction is achieved, while heat generated in the power chip 41 can be propagated from the jointing material 48 to the metal block 47 to the extent of the outside dimension of the semiconductor device. As a result, it is possible to cause heat to conduct through the insulation layer 45a by a larger area, and improved heat radiation can be obtained.

Further, since the metal block 47 is jointed to the lead frame 2a on its other main surface opposite to the power chip 41, it is possible to determine size of the metal block 47 without affecting the wiring of the aluminum wire 44.

Furthermore, the lead frame 2a and the metal block 47 are jointed just before the molding step such manufacturing can be performed up to the wiring of the aluminum wire 44 by the same process and apparatus as conventional ones. This permits a reduction of new capital investments and the like.

On the other hand, providing the metal block 47 on the other main surface of the lead frame 2a results in an increase in a contact area with the mold resin flow in the molding step and also in an increase in the accompanying viscous force.

In the power semiconductor device according to the first embodiment, however, the lead frame 2a with the power chip 41 mounted on its one side main surface and the metal block 47 mounted on the other main surface has the plurality of suspension lead parts 2b and 2e. The lead frame 2a is thus brought into a state of a beam supported at two or more positions in the molding step for sealing the mold resin 45. This can improve the stiffness of the lead frame 2a.

As a result, the mold resin 45 can be maintained in a uniform thickness, and the insulation layer 45a of the mold resin 45 under the metal block 47 can be made thinner. Therefore, improved heat radiation properties can be obtained while securing insulation properties.

<Second Preferred Embodiment>

Figure 10:
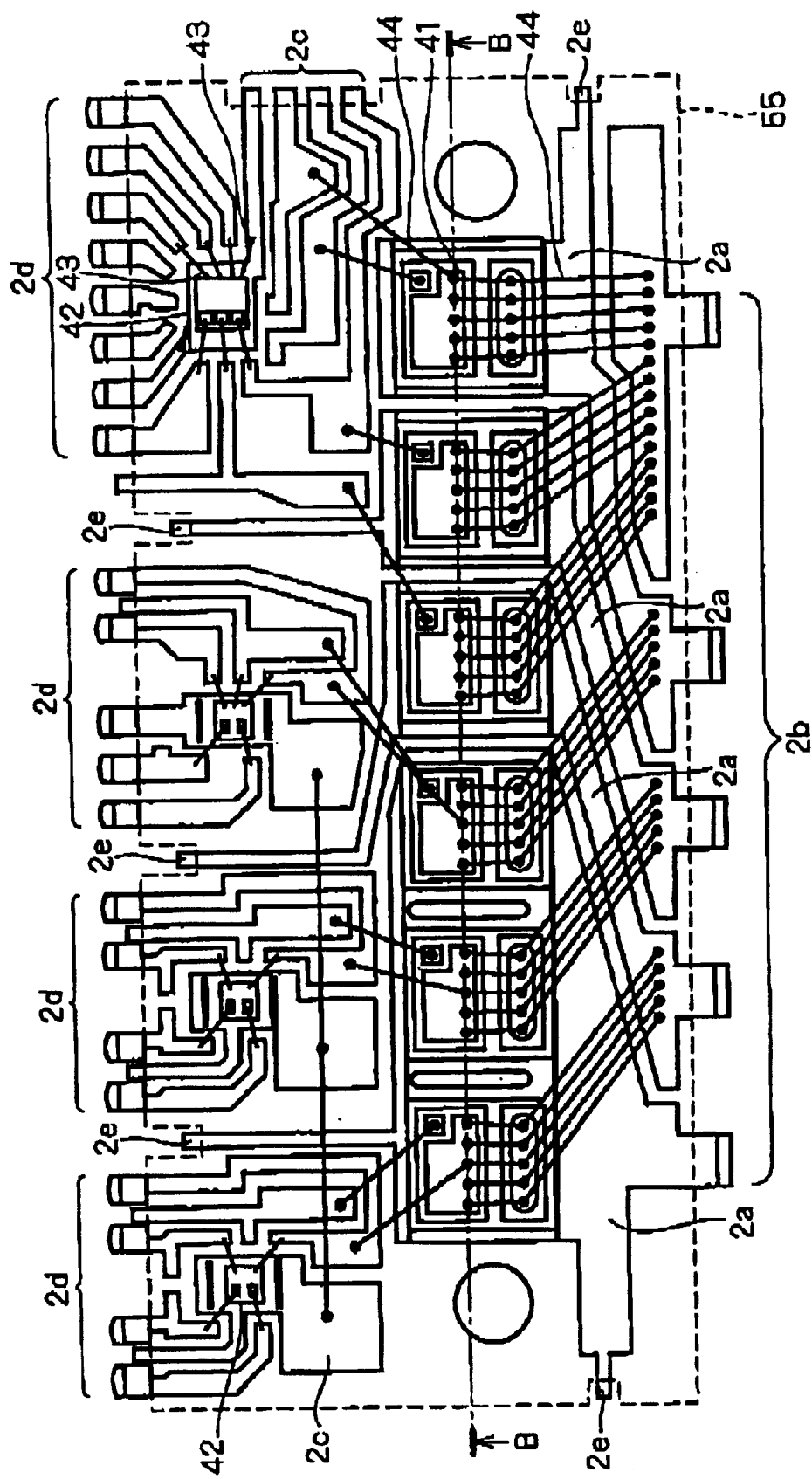
FIG. 10 is a plan view schematically illustrating a planar structure of a power semiconductor device according to a second preferred embodiment of the invention before resin sealing.
Figure 11:
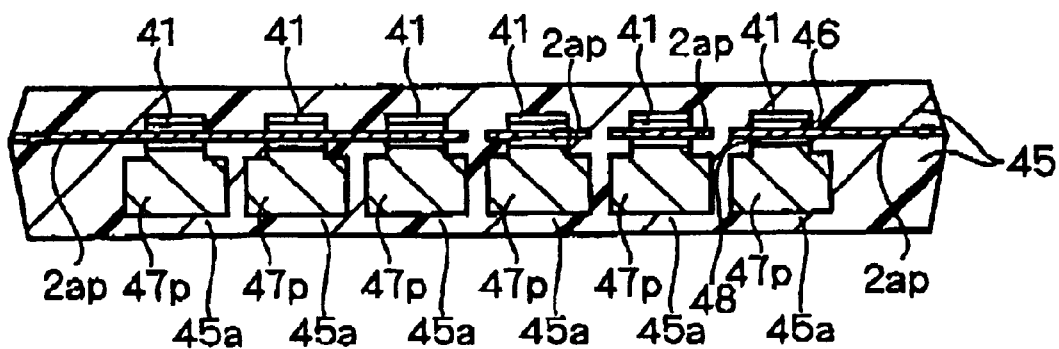
FIG. 11 is a sectional view schematically illustrating a sectional structure of the power semiconductor device according to the second preferred embodiment after the resin sealing.

FIG. 10 is a plan view schematically illustrating a planar structure of a power semiconductor device according to the second preferred embodiment of the invention before resin sealing. FIG. 11 is a sectional view schematically illustrating a sectional structure of the power semiconductor device according to the second embodiment after the resin sealing. FIG. 11 corresponds to a section along the line B—B of FIG. 10 after the resin sealing.

Referring to FIGS. 10 and 11, a method of manufacturing the power semiconductor device according to the second embodiment will be described.

A plurality of power chips 41 and a plurality of integrated circuit chips 42 are mounted on one side main surfaces of the lead frames 2a and 2c, respectively, with the jointing material 46 using the die bonding technique. At this time, as shown in FIG. 11, a plurality of separated (partial) lead frames 2ap each have the one side main surface on which at least one power chip 41 is mounted.

Thereafter, each of the power chips 41 is electrically connected to a predetermined inner lead of the lead frame 2a and part of inner leads of the inner lead frame 2c by the aluminum wire 44 using the die bonding technique. The integrated circuit chip 42 and a predetermined inner lead of the lead frame 2c are also electrically connected by the gold wire 43.

Next, a plurality of partial metal blocks 47p are mounted on the other main surfaces of the plurality of partial lead frames 2ap. More specifically, The plurality of partial metal blocks 47p are placed on the other main surfaces of the partial lead frames 2ap and jointed thereto with the jointing material 48 so as to have one-to-one correspondence with a plurality of power chips 41 and to face a corresponding one of the power chips 41, respectively.

Thereafter, transfer molding is performed to seal the whole. A gap between adjacent partial metal blocks 47p and 47p is filled with the mold resin 45, and the metal blocks 47p are insulated from one another. Accordingly, the plurality of power chips 41 can be provided within a single power semiconductor device while the partial metal blocks 47p remain insulated from one another.

The plurality of partial metal blocks 47p are made of aluminum or copper, for example, as in the first preferred embodiment. Heat generated in each of the power chips 41 is emitted to the outside through the jointing material 46, the lead frame 2a, the jointing material 48, the metal block 47 and the insulation layer 45a.

The jointing material 48 is not required to ensure electric insulation between the lead frame 2a and the metal block 47 as in the first embodiment. Thus, any material can be employed without considering its insulation breakdown voltage. Therefore, the jointing material 48 may be made of a material such as solder that has a thermal conductivity better than that of the insulation layer 45a. As a result, heat generated in each of the power chips 41 is conducted well from the lead frame 2a to the metal block 47.

The power semiconductor device according to the second embodiment having the above-described structure further achieves the following effects in addition to the same effects obtained in the first embodiment.

There is concern that by using the plurality of partial metal blocks 47p, an increase in the viscous force and the complexity of the flow may cause variations in the thickness of the resin under the lead frames 2ap on which the power chips 41 are mounted.

In the semiconductor device of the second embodiment, however, the (partial) lead frames 2ap for the power chip each have the suspension lead part 2e provided thereon as in the first embodiment, and thus can be supported by the plurality of suspension lead parts (2b, 2e) in the molding step.

As a result deformation (or displacement) of the lead frames 2ap is suppressed such that the mold thickness under the metal blocks 47p is a uniform thickness. Thus, high heat radiation properties can be achieved while maintaining insulation properties.

Figure 12:
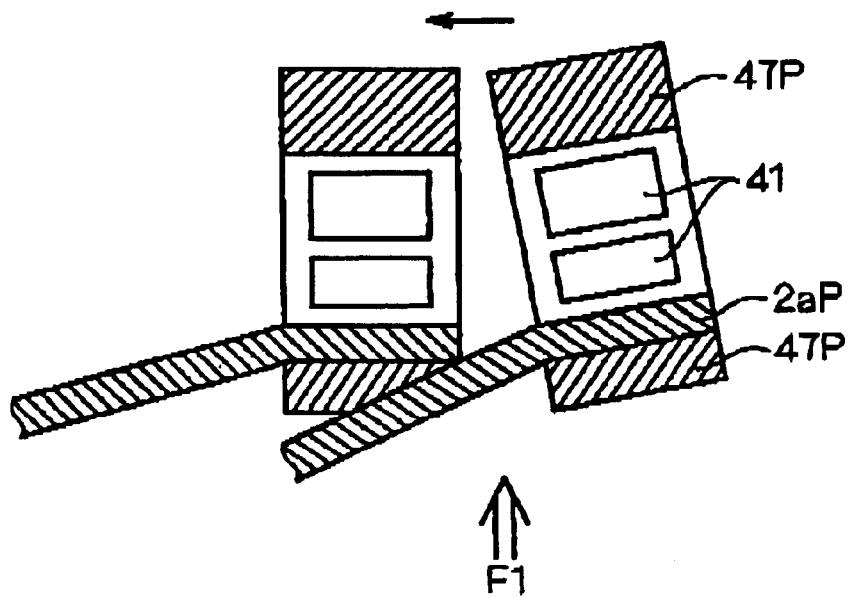
FIG. 12 is an explanatory view schematically illustrating the state of partial metal blocks adjacent to each other.

FIG. 12 is an explanatory view schematically illustrating the state of partial metal blocks 47p adjacent to each other. As shown in FIG. 12, the lead frames 2ap on which the power chips 41 are mounted are long and thin extending diagonally with respect to an injecting direction of the mold resin. Thus, the lead frames 2ap are deformed (or displaced) and bent in a direction perpendicular to the resin flowing direction such that there occurs a contact failure between adjacent lead frames 2ap and 2ap.

However, since the structure in which the suspension lead part 2e is provided as described above permits a substantial suppression of deformation of the lead frames 2ap in the molding step, adjacent partial metal blocks 47p and 47p are reliably prevented from being in contact with each other by their lead frames 2ap and the other elements. This permits a reduction in the thickness of the mold resin 45 between the adjacent partial metal blocks 47p and 47p. Thus, higher heat radiation properties can be achieved, and the power semiconductor device can be reduced in size.

The plurality of partial metal blocks 47p are placed in one-to-one correspondence with a plurality of power chips 41 and face a corresponding one of the power chips 41, respectively. Each of the metal blocks can thus be employed in correspondence with the power chips 41. In consequence the power chips 41 have a uniform temperature. This makes it easier to obtain operation assurance of the power semiconductor device and permits an extension of the life of the power chips 41.

<Third Preferred Embodiment>

Figure 13:
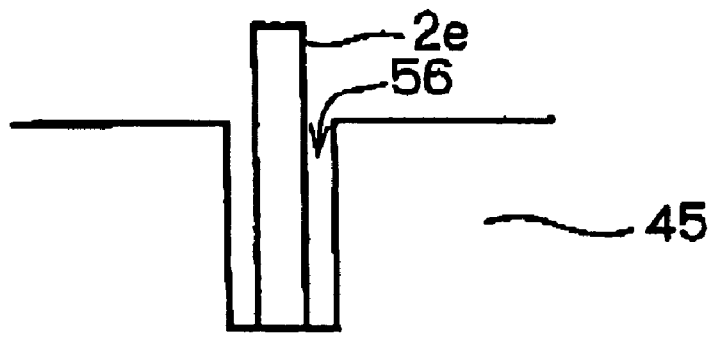
FIG. 13 is a plan view schematically illustrating a peripheral structure of a suspension lead part of a power semiconductor device according to a third preferred embodiment of the invention.

FIG. 13 is a plan view schematically illustrating a peripheral structure of a suspension lead part of a power semiconductor device according to the third preferred embodiment of the invention. As shown in FIG. 13, an end of the suspension lead part 2e is disposed in a cavity 56 formed in the peripheral region of the mold resin 45. This structure allows the length of the suspension lead part 2e formed in the region 55 (FIGS. 6 and 10) to be shorter than that in the case where the mold resin 45 does not have a cavity. Accordingly, it is possible to increase the stiffness of the lead frame 2a of the power chip 41 in the molding step. As a result, the lead frame 2a is hardly deformed, allowing the mold thickness to be made still thinner, and a power semiconductor device with less thermal resistance and excellent heat radiation properties can thus be obtained.

Further, providing the cavity 56 for the mold resin 45 permits an increase in a creepage distance which is an insulation distance between the suspension lead part 2e projecting from the mold resin 45 and an outer periphery of the mold resin 45. Thus, improved insulation properties can be obtained without increasing the size of the semiconductor device.

<Fourth Preferred Embodiment>

Figure 14:
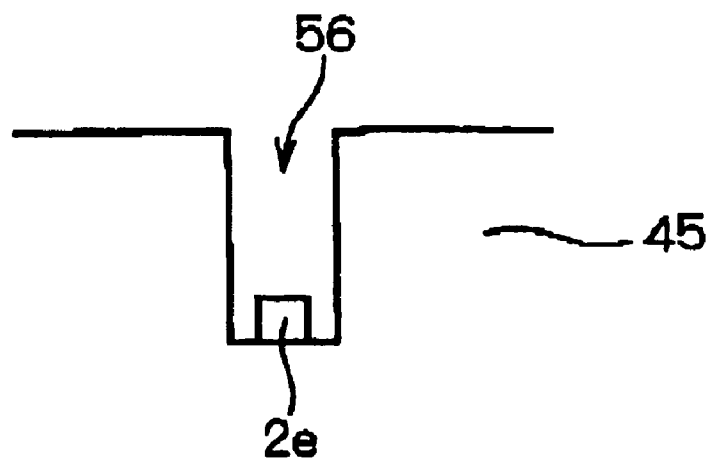
FIG. 14 is a plan view schematically illustrating a peripheral structure of a suspension lead part of a power semiconductor device according to a fourth preferred embodiment of the invention.
Figure 15:
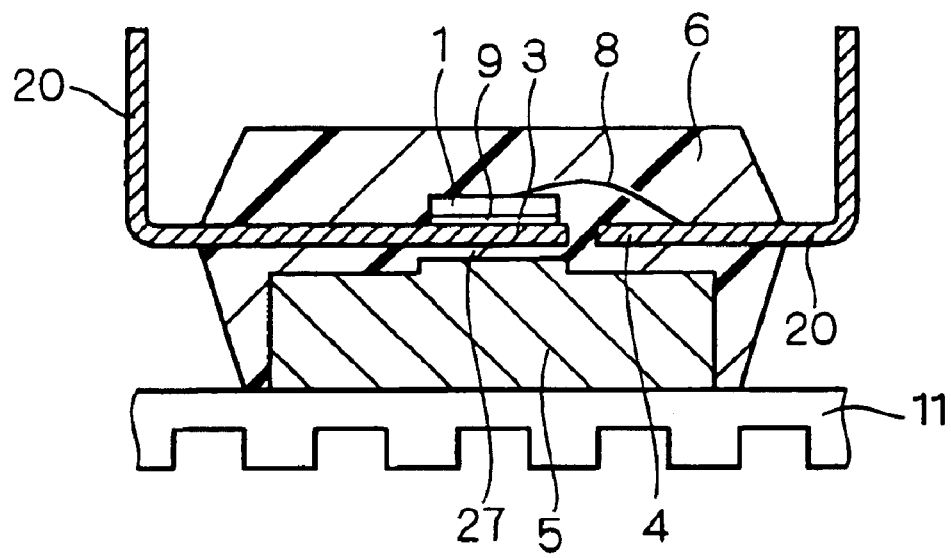
FIG. 15 is a sectional view schematically illustrating a structure of the power semiconductor device according to the background art.

FIG. 14 is a plan view schematically illustrating a peripheral structure of a suspension lead part of a power semiconductor device according to the fourth preferred embodiment of the invention. As shown in FIG. 14, the end of the suspension lead part 2e is disposed in the cavity 56 formed on the mold resin 45 as in the third embodiment, and is cut in such a manner as to be fit into the cavity 56.

More specifically, in the present embodiment, the end of the suspension lead part 2e is cut at an inner position with respect to the outermost surface of the mold resin 45. As a result, the end of the suspension lead part 2e is fit into the cavity 56.

As described above, the power semiconductor device according to the present embodiment, in which the suspension lead part 2e is fit into the cavity 56 of the mold resin 45, achieves the effect of preventing inconvenience of being caught in at packaging and handling, thereby simplifying handling, in addition to the effects achieved by the third embodiment.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   first and second semiconductor chips;
   first and second lead frames having one side main surface on which said first and second semiconductor chips are mounted, respectively;
   a metal block provided on the other main surface of said first lead frame; and
   resin formed to cover said first and second semiconductor chips, said first and second lead frames and said metal block,
   wherein said first lead frame has a plurality of suspension lead parts projecting from said resin,
   wherein said first semiconductor chip includes a plurality of first semiconductor chips,
   said first lead frame includes a plurality of first partial lead frames,
   said metal block includes a plurality of partial metal blocks, and said plurality of first partial lead frames each have one side main surface on which at least one of said plurality of first semiconductor chips is mounted, the other main surface on which at least one of said plurality of partial metal blocks is provided and a plurality of suspension lead parts projecting from said resin.

2. The semiconductor device according to claim 1, wherein
said metal block is provided to face said first semiconductor chip.

3. The semiconductor device according to claim 1, wherein
said metal block is jointed to the other main surface of said first lead frame with a jointing material and has one surface opposite to the other surface in contact with said jointing material, said one surface being larger than the other surface.

4. The semiconductor device according to claim 1, wherein
said first semiconductor chip includes a power chip.

5. The semiconductor device according to claim 4, wherein
said second semiconductor chip includes an integrated circuit chip for controlling said first semiconductor chip.

6. The semiconductor device according to claim 4, wherein
said power chip includes at least one of an insulated gate bipolar transistor and a fly wheel diode.

7. The semiconductor device according to claim 1, wherein
said plurality of partial metal blocks have one-to-one correspondence with said plurality of first semiconductor chips and are provided to face a corresponding one of said first semiconductor chips, respectively.

8. A semiconductor device comprising:
first and second semiconductor chips;
first and second lead frames having one side main surface on which said first and second semiconductor chips are mounted, respectively,
a metal block provided on the other main surface of said first lead frame; and
resin formed to cover said first and second semiconductor chips, said first and second lead frames and said metal block,
wherein said first lead frame has a plurality of suspension lead parts projecting from said resin,
wherein said resin has a cavity in a peripheral region thereof, and
at least one of said plurality of suspension lead parts is disposed in said cavity.

9. The semiconductor device according to claim 8, wherein
at least one of said plurality of suspension lead parts is provided to fit into said cavity.

10. The semiconductor device according to claim 8, wherein
said metal block is provided to face said first semiconductor chip.

11. The semiconductor device according to claim 8, wherein
said metal block is jointed to the other main surface of said first lead frame with a jointing material and has one surface opposite to the other surface in contact with said jointing material, said one surface being larger than the other surface.

12. The semiconductor device according to claim 8, wherein
said first semiconductor chip includes a power chip.

13. The semiconductor device according to claim 12, wherein
said second semiconductor chip includes an integrated circuit chip for controlling said first semiconductor chip.

14. The semiconductor device according to claim 12, wherein
said power chip includes at least one of an insulated gate bipolar transistor and a fly wheel diode.

* * * * *